US006936817B2

(12) United States Patent
Feuerbaum

(10) Patent No.: US 6,936,817 B2
(45) Date of Patent: Aug. 30, 2005

(54) OPTICAL COLUMN FOR CHARGED PARTICLE BEAM DEVICE

(75) Inventor: Hans-Peter Feuerbaum, Heimstetten (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 298 days.

(21) Appl. No.: 10/297,864

(22) PCT Filed: Jan. 29, 2001

(86) PCT No.: PCT/EP01/00931

§ 371 (c)(1),
(2), (4) Date: Mar. 4, 2003

(87) PCT Pub. No.: WO01/57910

PCT Pub. Date: Aug. 9, 2001

(65) Prior Publication Data

US 2003/0155521 A1 Aug. 21, 2003

(30) Foreign Application Priority Data

Feb. 1, 2000 (EP) .............................................. 00101987

(51) Int. Cl.$^7$ ..................... H01J 27/00; H01J 37/244; H01J 37/317
(52) U.S. Cl. ..................... 250/310; 250/309; 250/311; 250/396 R; 250/398; 250/492.2; 250/289
(58) Field of Search ..................... 250/309–311, 396 R, 250/398, 492.2; 200/289

(56) References Cited

U.S. PATENT DOCUMENTS

| 3,678,333 | A | * | 7/1972 | Coates et al. ................ 315/382 |
| 4,713,543 | A | | 12/1987 | Feuerbaum et al. |
| 5,111,054 | A | | 5/1992 | Slingerland |
| 5,502,306 | A | * | 3/1996 | Meisburger et al. ......... 250/310 |
| 5,563,415 | A | * | 10/1996 | Crewe ................ 250/396 ML |
| 5,576,483 | A | * | 11/1996 | Bonin ......................... 73/105 |
| 5,578,821 | A | * | 11/1996 | Meisberger et al. ........ 250/310 |
| 5,661,235 | A | * | 8/1997 | Bonin ......................... 73/105 |
| 5,869,751 | A | * | 2/1999 | Bonin ......................... 73/105 |
| 5,998,790 | A | * | 12/1999 | Downing .................... 250/311 |
| 6,051,839 | A | * | 4/2000 | Crewe ................ 250/396 ML |
| 6,410,923 | B1 | * | 6/2002 | Crewe ................ 250/396 ML |
| 2003/0127594 | A1 | * | 7/2003 | Schneiker et al. .......... 250/311 |
| 2003/0155521 | A1 | * | 8/2003 | Feuerbaum ............. 250/396 R |
| 2003/0155525 | A1 | * | 8/2003 | Okura et al. ........... 250/441.11 |

FOREIGN PATENT DOCUMENTS

WO   WO 99/45565 A   9/1999

* cited by examiner

*Primary Examiner*—John R. Lee
*Assistant Examiner*—Bernard Souw
(74) *Attorney, Agent, or Firm*—Sughrue Mion, PLLC

(57) ABSTRACT

The invention provides a miniaturized optical column for a charged particle beam apparatus for examining a specimen (14). The column is constituted by, among other things, a charged particle source (2) for providing a beam of charged particles (10); a lens system for guiding the beam of charged particles (10) from the source (2) onto the specimen (14); and a housing (40) which, during operation, is set on beam boost potential.

9 Claims, 4 Drawing Sheets

OPTICAL COLUMN FOR CHARGED PARTICLE BEAM DEVICE

This is a National stage entry under 35 U.S.C. §371 of Aaplication No. PCT/EP01/00931 filed Jan. 29, 2001; the disclosure of which is incorporated herein by reference.

FIELD OF THE INVENTION

The invention relates to an apparatus for the examination of specimen with a beam of charged particles. In particular, this invention relates to a miniaturized optical column for a charged particle beam device.

BACKGROUND OF THE INVENTION

Charged particle beam devices such as scanning and transmission or microprobe apparatuses, to quote only a few, are powerful instruments which permit the observation and characterization of heterogeneous organic and inorganic materials and their surfaces. In these instruments, the area to be examined is irradiated with a charged particle beam, which may be static or swept in a raster across the surface of the specimen. Depending on the specific application, the charged particle beam is more or less focused and the kinetic energy of the particles can vary considerably.

The types of signals produced when the charged particles impinge on a specimen surface include secondary electrons, backscattered electrons, Auger electrons, characteristic x-rays, and photons of various energies. These signals are obtained from specific emission volumes within the sample and can be used to examine many characteristics of the sample such as composition, surface topography, crystallography, etc.

Lately, attempts have been made to miniaturize charged particle beam devices. Several of these devices could then be grouped together to simultaneously examine larger areas of the specimen or they could be installed in process lines with tight space restrictions. Furthermore, since spherical and chromatic aberrations of particle beam devices scale proportional to their geometrical dimensions, as long as the potential remains constant, miniaturized devices would be able to deliver higher spatial resolution and high beam current in a given spot size.

In general, most of the present charged particle devices are between 0.5 and 1.2 meters high with an average diameter of about 15 cm –40 cm. Distinct from that, developers are aiming at producing beam devices which are smaller than 10 cm with an average diameter of about 4 cm. However, since modem charged particle beam apparatuses are complex technical instruments with sophisticated vacuum systems, alignment mechanism and electronic control units, their geometrical dimensions can not simply be shrinked proportionally, even though this is attempted wherever possible.

In low voltage applications, the performance of standard charged particle beam devices can considerably be increased by using a so called beam booster. It accelerates the charged particles within the optical column of the microscope to high kinetic energy and decelerates them before hitting the specimen. The deceleration step is mostly carried out when the charged particles pass the objective lens.

In general, the beam boost is achieved by surrounding the beam in the column with electrodes being shifted to a high accelerating potential. In microscopes with isolation valves positioned between the charged particle source and the specimen chamber or with any other conductive part arranged in the vicinity of the charged particle beam column, these parts are also shifted on the accelerating potential. The corresponding shielding electrodes, the valves or other conductive parts require insulation against the grounded column housing. Usually ceramic is used as insulating material. The end edges of the insulators are folded or provided with grooves to increase the creepage path. In miniaturized charged particle beam columns, however, this kind of isolation is not satisfactory.

SUMMARY OF THE INVENTION

The present invention intends to provide an improved apparatus for examining a specimen with a beam of charged particles. According to one aspect of the present invention, an apparatus is provided as specified in independent claim 1.

By setting the housing of the miniaturized optical column on beam boost potential a complicated arrangement of insulators between parts being set during operation either on ground or on beam boost potential can be omitted. Complications arise from the reduced space within the column which obliges to miniaturize the insulators in addition of having to form long creepage paths at their ends. Another advantage is that special electrodes for shielding the beam path (e.g. from the potential of the grounded housing) are not required anymore.

Furthermore, in state of the art devices, some insulators have to be soldered to metal to vacuum seal the column. The sealing between insulator and metal has to be mechanically weak because it has to compensate for mechanical tensions resulting from the thermal treatment during the bake out of the column which could affect the stability of the column.

Further advantages, features, aspects and details of the invention are evident from the dependent claims, the description and the accompanying drawings. The claims are intended to be understood as a first non-limiting approach of defining the invention in general terms.

A beam boost potential, in general, is an accelerating potential applied somewhere between the source and the specimen. The absolute value of the potential of the components used for the beam boost is only of secondary importance. For a beam boost, it is primarily important to establish a potential difference between the source of the charged particles and the components responsible for the beam boost so that the particles get accelerated to high speed on their way through the column to the specimen. The housing, in general, is used to accommodate optical components for guiding and shaping the beam of charged particles. Usually, it is made of electrically and sometimes magnetically conductive material e.g. mu-metal to shield the interior of the optical column from disturbing electric and/or magnetic fields.

According to a further aspect of the present invention, the housing comprises a valve, deflection units, detectors, or other parts and components which are arranged in the vicinity of the beam path. Which of these parts and components needed and their specific set up within the column, greatly depends on the application for which the device is intended to be used. Should these parts be arranged in the vicinity of the beam path so that their electric fields could have a negative influence on the beam trajectory then they are preferably set on beam boost potential. Naturally, the potential of these parts might slightly deviate from the beam boost potential; electric deflection units for example require these differences in potential in order to deflect the beam.

By keeping as many parts as possible together with the housing on beam boost potential, the number of insulators used within the miniaturized optical column can be significantly reduced. Thereby, it is still within the scope of the invention if certain parts within the column are nevertheless isolated from the housing e.g. the charged particle source.

The present invention is advantageously used in combination with miniaturized electro- and magnetostatic (with permanent magnets) columns. This avoids putting the power supply units which drive the electric coils on beam boost potential and allows for more stable operation of the column.

The invention is also directed to methods by which the described apparatus operates. It includes method steps for carrying out every function of the apparatus. Furthermore, the invention is also directed to apparatus for carrying out the disclosed methods and including apparatus parts for performing each described method step. These method steps may be performed by way of hardware components, a computer programmed by appropriate software, any combination of the two or any other manner.

BRIEF DESCRIPTION OF THE DRAWINGS

Some of the above indicated, as well as more detailed aspects of the invention, will be described in the following description and partially illustrated with reference to the figures. Therein.

DESCRIPTION OF THE PREFERRED EMBODIMENTS

Figure 2:
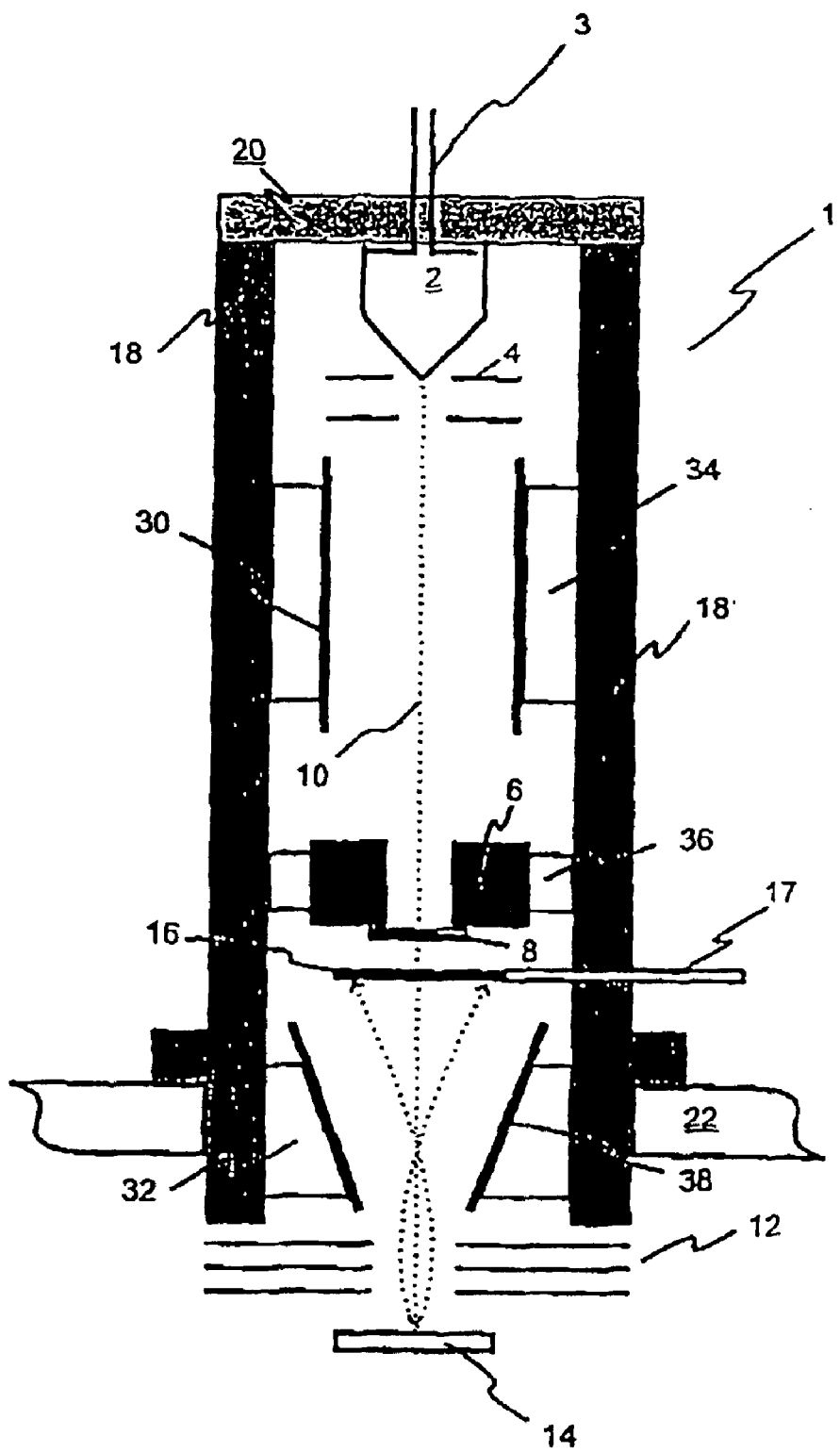
FIG. 2 shows an optical column of a charged particle device of the state of the art.

A charged particle beam device of the state of the art is schematically shown in FIG. 2. The charged particle beam device 1 comprises a top cover plate 20 to which a charged particle source 2 is attached. The wires 3 for providing the source 2 with power go through the top cover plate to a power source. In electron beam devices, electron sources such as Tungsten-Hairpin guns, Lanthanum-Hexaboride Guns, Field emission guns etc. can be used. The invention, however, is not limited to electron sources; it can be used together with all kinds of charged particle sources. In the state of the art embodiment shown in FIG. 2 an extractor and a suppressor 4 is arranged below the particle source 2. The extractor which is, for example, set on an accelerating potential below the beam boost potential attracts the charged particles coming from the source. Contrary to that, the suppressor, which is arranged between the accelerator and the source, is set on a suppression potential to limit the number of particles getting pulled towards the extractor. This way the beam current can be regulated and prevented from becoming to high.

After the beam of charged particles 10 has been formed and left the source, a system of electromagnetic lenses, deflection coils, and stigmators is involved in the control and refinement of the charged particle beam before it hits the specimen. The particular arrangement of these components depends strongly on the specific applications of the charged particle device used. In many devices, a series of two or three condenser lenses (not shown) are used to successively demagnify the beam spot which is essential for better resolutions at high magnifications. A stigmator (not shown) is a component that is used to control any distortions in the roundness of the spot formed by the beam that is scanned over the specimen. Beam spots that are not round will generate an image on the viewing monitor that is smeared in one direction. If required, a scan unit (not shown) is arranged in the optical column. For example, a set of small coils of wire are energized by a varying voltage produced by the scan generator and create a magnetic field that deflects the beam of charged particles back and forth in a controlled pattern called a raster. The raster is very similar to the raster in a television receiver.

The final lens in or below the column, called the objective lens, focuses the image by controlling the movement of the crossover along the optical axis (z-axis) of the column. In FIG. 2 an electrostatic lens 12 is arranged below the column. In many applications, however, a magnetic lens with a controllable current I through its windings is used. Due to the large control current cooling is sometimes required.

When the particles of the beam 10 strike the surface of specimen 14, they undergo a series of complex interactions with the nuclei and electrons of the atoms of the sample. The interactions produce a variety of secondary products, such as electrons of different energy, X rays, heat, and light. Many of these secondary products are used to produce the images of the sample and collect additional data from it. Detectors for collecting the secondary products can either be circularly arranged around the optical axis or at the side. FIG. 2 shows a disk shaped collector 16 with a bore at its center to let the primary beam pass on its way from source 2 to specimen 14. In this embodiment, the detector is attached to a light guide 17 which goes through housing 18 and connects the detector with an imaging electronic (not shown). The light pulses created by the secondary products impinging onto detector 16 are guided outside the housing 18 and used for forming the final image.

Particularly in low voltage applications, the performance of a charged particle beam device can be considerably increased by using a beam booster. The beam booster causes the charged particles to travel at high speed through the optical column and then slows them down before they hit the specimen. The particles in the beam have different kinetic energies and thus different wavelength. The differing wavelengths cause the particles to be brought to focus at different points which blurs the image. The ratio of the difference in kinetic energy to the mean kinetic energy of the charge particles $\Delta E/E$ influences the extent to which the image is out of focus. Since the variation in kinetic energy $\Delta E$ is largely independent with respect to the total kinetic energy of the particle E, the lens defect can be reduced by letting the charged particles enter the objective lens at a relative high speed and subsequently decelerate them before they hit the specimen.

A beam boost in a typical optical column of a charge particle device is realized by letting the charged particles on their way from the source to the objective lens see a high potential. This is achieved by shielding the beam path from all conductive parts having a potential considerably different to the beam boost potential. In the embodiment shown in FIG. 2, shielding electrodes 30 shield the beam path from the grounded housing 18 and, if required, from beam alignment coils which, in general, are also put on ground potential. For shielding electrodes 30, a so called liner tube is often used. In the lower part of the column, shielding electrodes 32 shield, for example, the beam path from the grounded housing 18. In the central part of the column a valve unit 6,8 is arranged. It separates the vacuum in the gun chamber from the vacuum prevailing in the specimen chamber (see e.g. FIG. 4). Furthermore, it allows replacement of the specimens without breaking the vacuum of the gun chamber by closing the sliding valve 8 which is attached to the holding unit 6. The sliding valve 8 and holding unit 6 are also put on beam boost potential so that they do not adversely effect the electrical field in the vicinity of the beam path. It should be noted, however, that depending on the particular setup of the optical column or the application used, a valve unit is not always required.

In certain devices used in the state of the art, the shielding electrodes and all other parts which are set on beam boost potential are connected to each other to form a single inner channel around the beam path. This results in very good shielding of the beam path from disturbing fields.

In general, the above mentioned components, shielding electrodes 30 (or liner tube), valve unit 6,8, shielding electrodes 32 need to be fixed to the grounded housing 18. This requires an isolation between the housing and these components. The difference in potential used to boost the beam is in general higher than 1 kV. Therefore, the insulators 34, 36, 38 have to be adapted to the high voltage difference.

The housing 18 is connected to the walls of the specimen chamber 22 which are only partially shown in FIG. 2. For security reasons the housing is grounded. The materials used for the housing are usually electrically and magnetically conductive to shield the inside from disturbing electric and magnetic fields.

Figure 1:
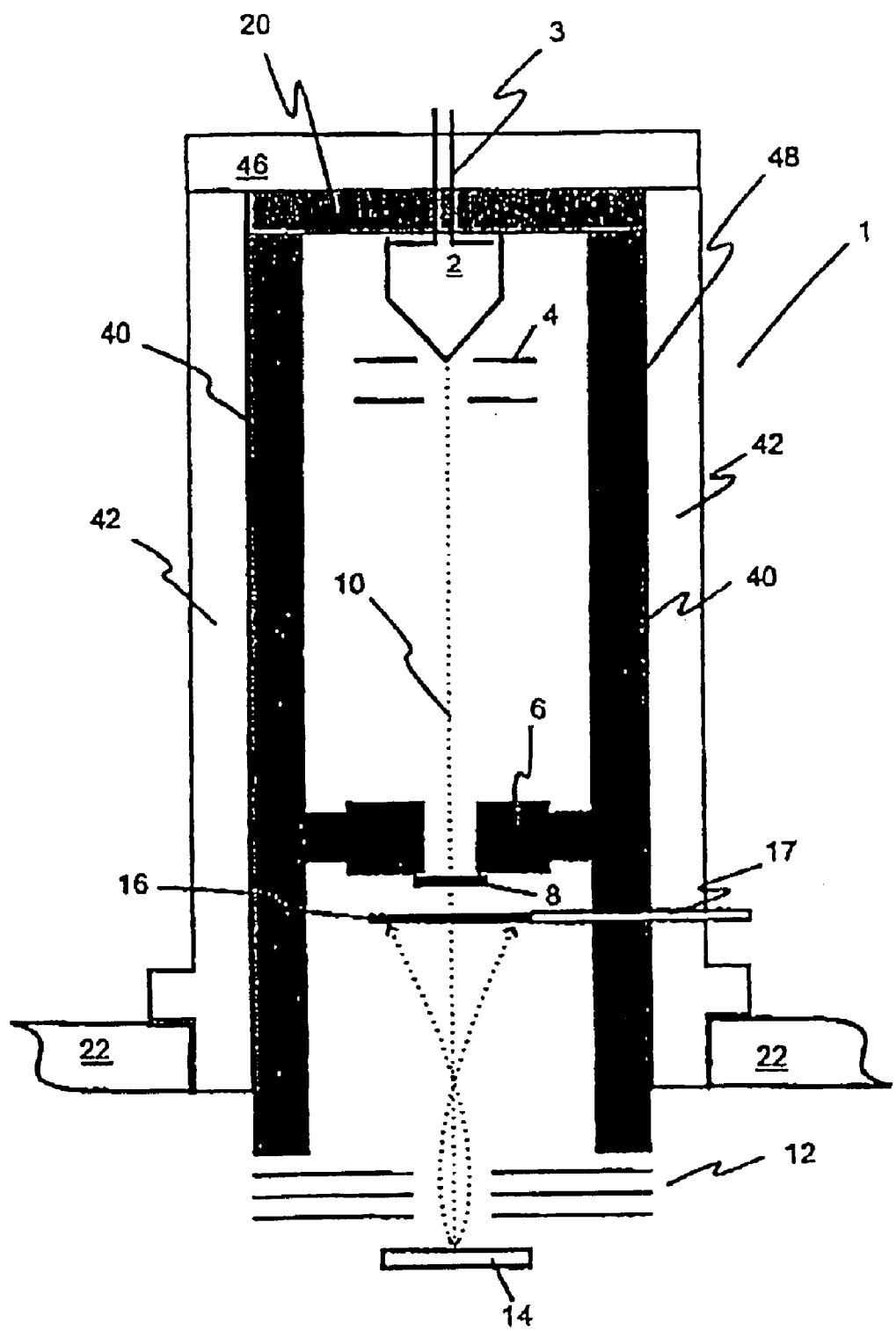
FIG. 1 shows an optical column of a charged particle device of the present invention whereby the housing is set on a beam boost potential.

FIG. 1 shows an embodiment of the present invention. Thereby, the same reference numbers denote corresponding parts. The charged particle beam device 1 with its housing 40 being put on beam boost potential during operation of the device comprises a charged particle source 2 with an accelerator and a suppressor 4. The power supply wires 3 for particle source 2 are laid through top cover plate 20. Below the particle source 2, a suppressor and accelerator unit regulates the beam current. A lens system for guiding the beam, stigmators, deflection coils etc. are not shown in FIG. 1. Only valve unit 6, 8 for dividing the optical column into two sections which can be held at different vacuum levels, (if necessary) is connected to housing 40 and put on beam boost potential. Consequently, valve unit 6, 8 does not require insulators and the electrical fields stemming from holding unit 6 and sliding valve 8 do not disturb the beam boost potential prevailing in the column.

Detector 16 is positioned in beam path 10 to collect secondary products. It is maintained at beam boost potential either with a conductive connection along light guide 17 or with any other conductive connection arranged between the detector and the housing or other conductive parts being put on beam boost potential.

It should be noted that not all optical columns need a valve unit 6, 8. Additionally, the detector does not always need to be located in the beam path. It can be positioned at the side or even outside and below the optical column e.g. in transmission microscopes. If a particular application necessitates an optical component to be arranged close to the beam path then it is preferred to keep it a beam boost potential. The possible disturbing influence of the electrical field of a component depends on its size, its distance to the beam path, the materials used, and its potential during operation of the charged particle beam device. This allows one to estimate to what extend it is necessary to put the respective part on beam boost potential. It is most preferred, however, to keep all possibly disturbing components or parts on beam boost potential.

FIG. 1 shows a electrostatic objective lens 12 with three electrodes below the housing 40 of the charged particle beam device. In a preferred embodiment, the upper electrode is maintained at beam boost potential. The middle electrode is used for focusing the charged particles coming from the source onto the specimen. Simultaneously, this electrode decelerates the charged particles before they hit the specimen. The lower electrode is primarily used for controlling, e.g. it adjusts the extracting field for secondary particles coming from the source. The use of three electrodes is not a necessity, in principal, only one electrode would suffice. However, this limits for example the options of regulating the focusing properties of the objective lens.

Top cover plate 20 is connected to housing 40 and therefore on beam boost potential. The wires 3 which supply charged particle source 2 with power and the source itself are in general not on beam boost potential. Isolation is provided between the top cover plate 20 on one side and wires 3 and source 2 on the other side. Alternatively, it is possible to maintain the top cover plate 20 at the potential of the charged particle source 2, but then the isolation needs to be provided between housing 40 and top cover plate 20.

Housing 40 and top cover plate 20 are surrounded by a cover 42 and top cover 46 which are put on ground potential. In between housing 40 and cover 42 and in between top cover plate 20 and top cover 46 an insulating layer 48 is put. The insulating layer could be a dielectric material of varying thickness or a sufficiently large air gap. Particularly in the latter case, it is preferred to round the edges of top cover plate 20 to reduce the likely hood of electric discharge. In addition, insulation is provided between wire 3 and top cover 46.

Figure 3:
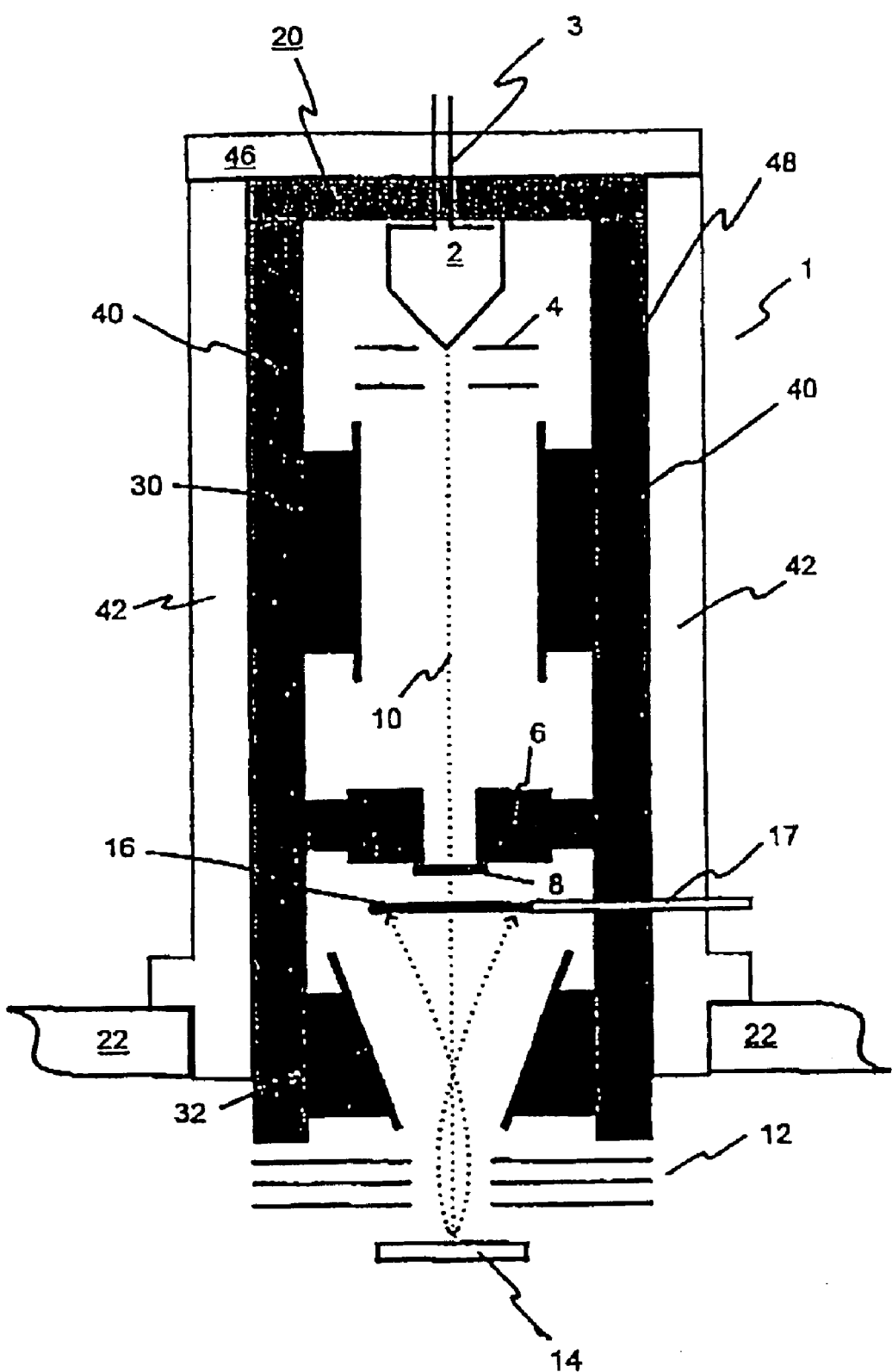
FIG. 3 shows a further embodiment of a charged particle beam device according to the present invention.

FIG. 3 shows the prior art charged particle beam device of FIG. 2, however, with omitted insulators. Shielding electrodes 30 and 32 are directly connected with housing 40 and on beam boost potential. Depending on the application, stigmators, deflection coils or any other components could be arranged behind them. It should be noted, however, that it is not mandatory to have these components arranged behind shielding electrodes. The optical column is surrounded by cover 42 and cover plate 46. Advantageously, all parts and components located between source 2 and objective lens are put on beam boost potential.

It is possible to place getter material close to the charged particle source to evacuate the gun chamber even more. Depending on the exact location, the getter material is either put on beam boost potential or on the potential of the charged particle source. Alternatively, a getter pump can be arranged outside the column and a tube connects the pump with the gun chamber. Naturally, the tube end extending into the gun chamber is preferably put on beam boost potential during operation. The parts of the tube which either go through the housing 40 or through cover 42 need to be insulated accordingly. This could be done with insulating layers and/or with flanges having insulating material at their interfaces.

Figure 4:
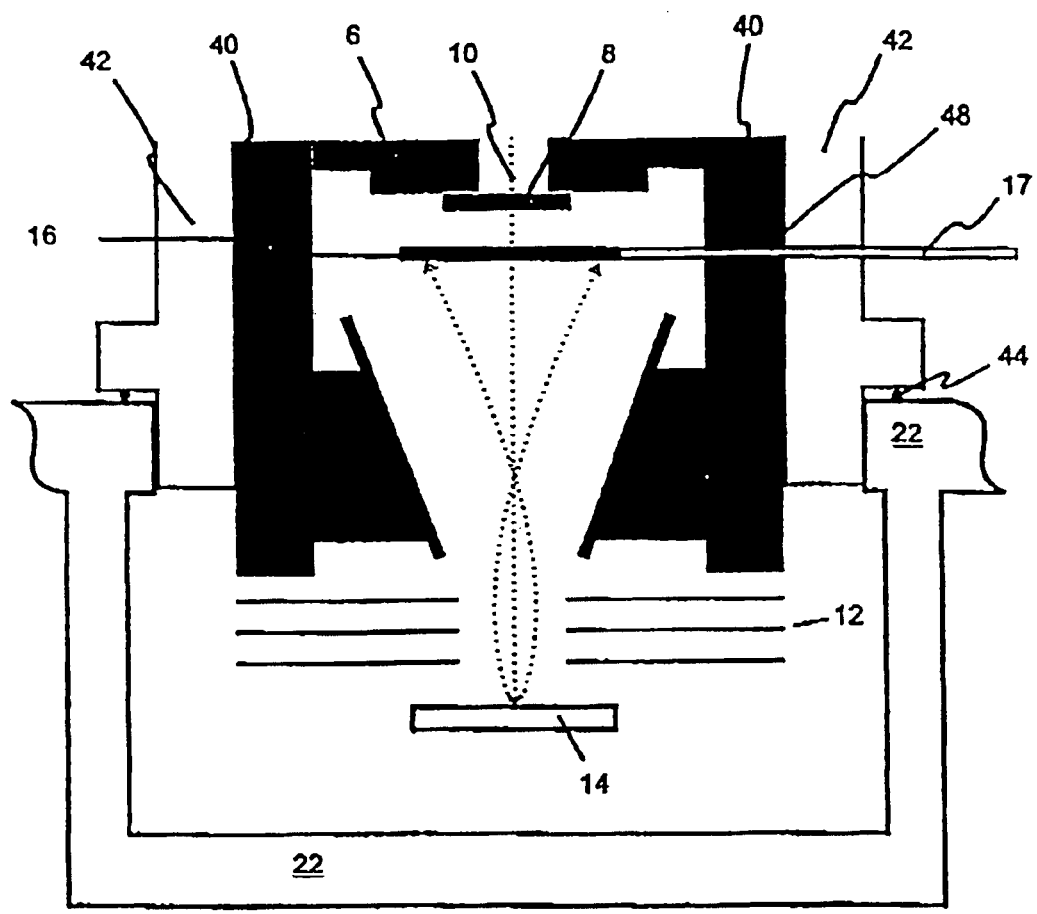
FIG. 4 shows the specimen chamber of a charged particle device of the present invention.

FIG. 4 shows the lower part of the optical column connected to the specimen chamber 22. In general, the specimen chamber has a separate vacuum pump (not shown) for evacuating the chamber. To avoid leakage, a sealing 44 e.g. o-ring is put between cover 42 and specimen chamber. Depending on the specific set up of the wall, an alternative or additional sealing can be put between housing 40 and cover 42.

What is claimed is:

1. A miniaturized optical column for a charged particle beam apparatus for examining a specimen 14 comprising:

a charged particle source 2 for providing a beam of charged particles 10;

a lens system for guiding the beam of charged particles 10 from said source 2 onto said specimen 14; and a housing 40, whereby during operation said housing is set on beam boost potential.

2. The optical column of claim 1, whereby the housing comprises a valve arranged between said particle source and said objective lens, whereby during operation said valve is set on beam boost potential.

3. The optical column of claim 1, whereby the housing comprises a deflection unit for scanning the charged particle beam over the specimen, whereby during operation said deflection unit is set on beam boost potential.

4. The optical column of claim 1, whereby the housing comprises a detector for collecting particles or photons created by the charged particle beam impinging on the specimen, whereby during operation said detector is set on beam boost potential.

5. The optical column of claim 1, whereby the housing 40 is surrounded by a cover 42 which is set on ground potential.

6. The optical column of claim 5, whereby an insulating layer 48 is arranged between said cover 42 and said housing 40.

7. The optical column of claim 1, whereby only electrostatic components are used within the housing.

8. The optical column of claim 1, whereby permanent magnetic components are used within the housing.

9. The optical column of claim 1, whereby an electrode for decelerating the charged particles before they hit the specimen is arranged above the specimen.

\* \* \* \* \*